United States Patent [19]
Violette

[11] Patent Number: 5,358,884
[45] Date of Patent: Oct. 25, 1994

[54] DUAL PURPOSE COLLECTOR CONTACT AND ISOLATION SCHEME FOR ADVANCED BICMOS PROCESSES

[75] Inventor: Michael P. Violette, Boise, Id.

[73] Assignee: Micron Technology, Inc., Boise, Id.

[21] Appl. No.: 943,840

[22] Filed: Sep. 11, 1992

[51] Int. Cl.⁵ .................................... H01L 21/265
[52] U.S. Cl. .................................... 437/341; 437/31; 437/26; 437/67; 148/DIG. 10
[58] Field of Search .................. 437/31, 48, 203, 34, 437/67, 26, 32, 909; 148/DIG. 10, DIG. 11

[56] References Cited

U.S. PATENT DOCUMENTS

| | | | |
|---|---|---|---|
| 4,648,173 | 3/1987 | Malaviya | 437/31 |
| 4,717,682 | 1/1988 | Taka et al. | 437/203 |
| 5,034,338 | 7/1991 | Neppl et al. | 437/203 |
| 5,061,646 | 10/1991 | Sivan et al. | 437/31 |
| 5,192,708 | 3/1993 | Beyer et al. | 437/203 |

FOREIGN PATENT DOCUMENTS

| | | | |
|---|---|---|---|
| 0017957 | 1/1985 | Japan | 437/31 |
| 0009150 | 1/1988 | Japan | 437/31 |
| 0215069 | 9/1988 | Japan | 437/31 |
| 0211668 | 8/1990 | Japan | 437/67 |
| 0312242 | 12/1990 | Japan | 437/31 |
| 0026129 | 1/1992 | Japan | 437/31 |

OTHER PUBLICATIONS

A Surrounding Gate Transistor (SGT) Cell for 64/256 Mbit DRAMs, IEDM 89-23, 1989 IEEE, Sunouchi et al., pp. 2.1.1–2.1.4.

*Primary Examiner*—Tom Thomas
*Assistant Examiner*—Tuan Nguyen
*Attorney, Agent, or Firm*—John D. Buchaca

[57] ABSTRACT

A scheme and method of fabrication for creating bipolar semiconductor devices with reduced size and greater speed while maintaining device isolation. Using a mesa structure isolated by trenches, collector contact is achieved by a vertical layer of polysilicon surrounding the mesa, deposited within the trench during fabrication.

6 Claims, 8 Drawing Sheets

DUAL PURPOSE COLLECTOR CONTACT AND ISOLATION SCHEME FOR ADVANCED BICMOS PROCESSES

FIELD OF THE INVENTION

This invention relates to semiconductor integrated circuits (IC's), specifically to increasing the density of circuit devices within such IC's, offering improved fabrication processing, and more particularly, to improving a bipolar semiconductor's operational characteristics while reducing its overall size.

While this invention proposes a scheme for reducing the size and increasing the speed of many semiconductor devices found in metal-oxide-semiconductor (MOS), bipolar and bipolar complementary metal-oxide-semiconductor (BiCMOS) integrated circuits, for purposes of consistency, simplicity and readily accessible discussion, this specification will refer in detail to bipolar transistors.

BACKGROUND OF THE INVENTION

The operation of semiconductor bipolar devices is well documented. The trend toward greater miniaturization requires efficient use of available space when designing any device. Typically, field effect transistors (FET's) have been employed in many applications due to their small size relative to bipolar transistors. Although FET's and their associated circuits are much smaller than bipolar transistors and well suited for creating small memory cells, they do not operate as fast as bipolar transistors because of their higher inherent reactance. When designing bipolar transistors for speed, reactance should be held to a minimum.

Leakage currents degrade the performance of any semiconductor device. When these currents are low it is said the device is well isolated. Isolation, therefore, involves insulating and distancing adjacent devices thereby increasing overall circuit size. Therefore there is a design tradeoff between isolation and the size of the resulting circuitry.

SUMMARY OF THE INVENTION

The principal object of this invention is to increase the performance of integrated circuit devices while reducing their size. The secondary object is to provide a more reliable and cheaper fabrication process for creating IC's comprised of bipolar transistors.

These and other objects are achieved by placing the collector tap of a device such as a bipolar transistor within the isolating trench surrounding the transistor, allowing the collector tap to contact a greater portion of the collector layer.

DESCRIPTION OF THE PREFERRED EMBODIMENTS OF THE INVENTION

Figure 1:
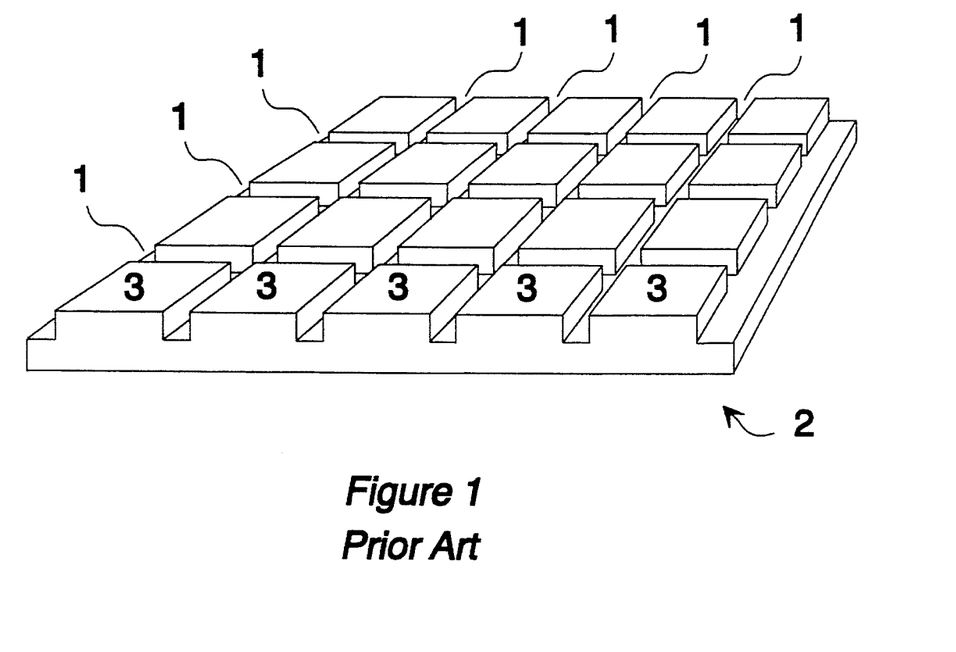
FIG. 1 is a perspective view of an idealized network of semiconductor mesas isolated by trenches.

Referring now to the drawing, FIG. 1 shows an idealized grid-like network of trenches 1 etched into a planar piece of silicon substrate 2. This substrate may have several stratified layers of differently treated silicon depending on the desired eventual circuit structure and function. Between the trenches, each rectangular silicon mesa 3 forms the basis for a bipolar transistor. These trenches are later filled with an insulating material effectively isolating each transistor and providing a surface upon which contact between devices can be accomplished. In an actual IC the grid structure of trenches is far more complex, less uniform, and each mesa or island may have a different device or devices created thereupon.

Figure 2:
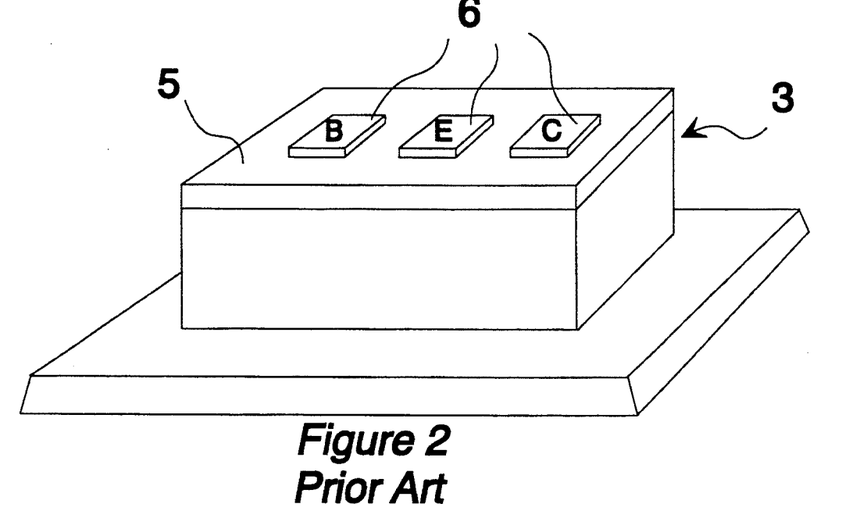
FIG. 2 is a perspective view of a semiconductor mesa forming the body of an idealized bipolar transistor as configured using the prior art.
Figure 3:
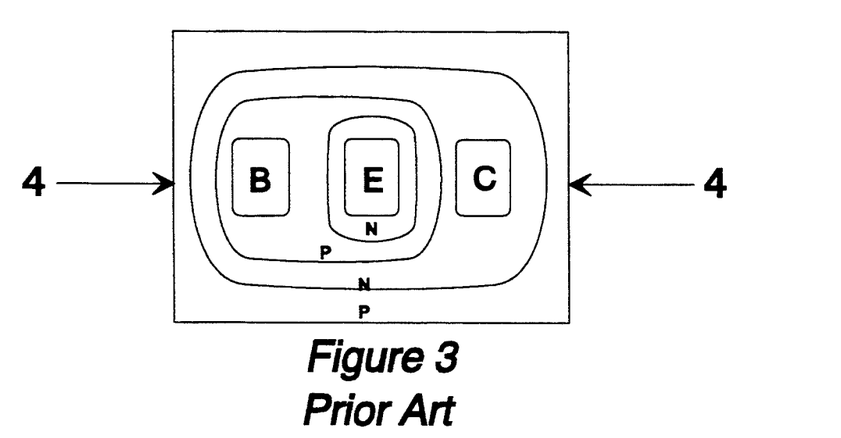
FIG. 3 is a plan view of a prior art semiconductor bipolar transistor.
Figure 4:
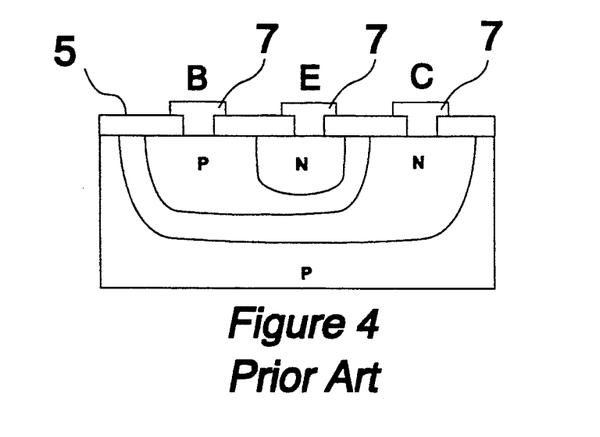
FIG. 4 is a cross-sectional view of a prior art bipolar transistor.

One such idealized bipolar transistor mesa 3 is blown up in FIG. 2. A plan view of this same mesa is seen in FIG. 3 and a cross-sectional view about section line 4 is seen in FIG. 4.

The top surface of the silicon mesa is formed with an insulating layer of silicon dioxide ($SiO_2$) 5. Atop this layer lie contact pads for the emitter, base and collector of the device 6. Each pad connects to its associated region of the transistor with a conductive tap 7 through the insulating $SiO_2$ layer.

Size and orientation of the regions is critical to the performance of the finished transistor. In conventional semiconductor bipolar transistors care must be taken in designing the junction between the base and collector due to the spreading of the depletion region during operation.

It is apparent that the structural design of this NPN type bipolar transistor requires horizontal space for the collector tap structure as well as the emitter and base structures. The collector tap in this case is only connected to a small portion of the n-type region that forms the collector. This produces an undesirably high collector resistance requiring higher operating voltages and resulting in greater power consumption. This design also creates an inherent capacitance between emitter and collector which limits the speed of the transistor.

Figure 5:
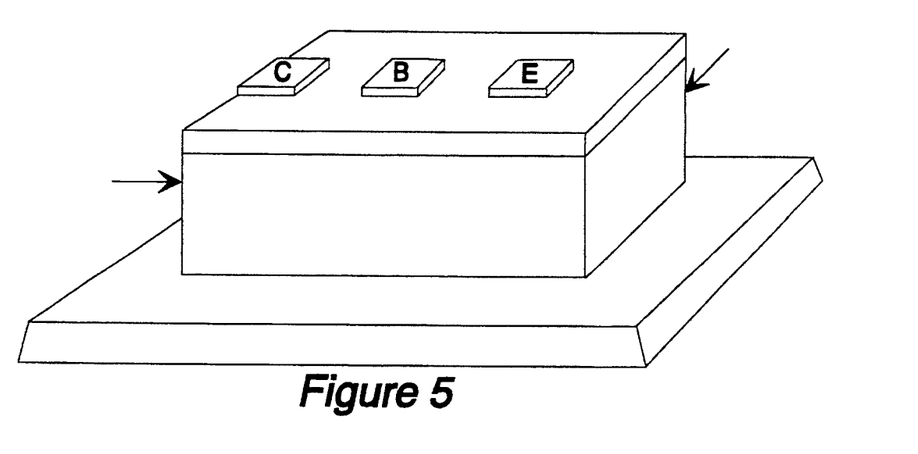
FIG. 5 is a perspective view of a semiconductor mesa forming the body of a bipolar transistor according to the invention.
Figure 6:
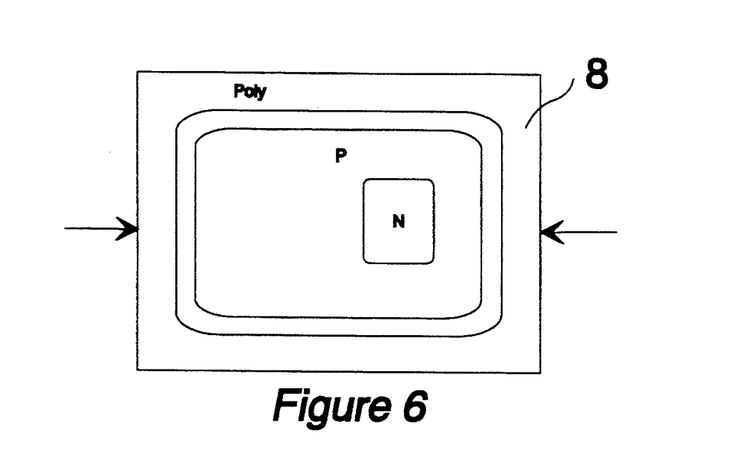
FIG. 6 is a plan view cross-section of a bipolar transistor using the invention.
Figure 7:
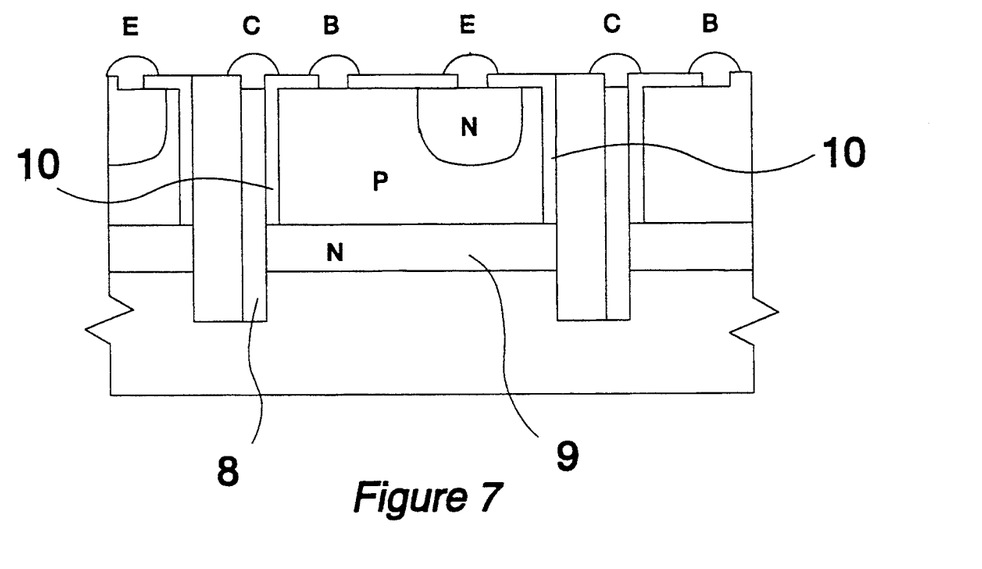
FIG. 7 is a side cross-section view of a bipolar transistor using the invention.

With the application of the invention, as seen in FIG. 5-7, a device of much smaller size is realized. The structure still forms a NPN type bipolar transistor. However, here the collector tap is formed by a surrounding vertical layer of conductive polysilicon 8 which contacts a buried n-type layer 9 that forms the collector. Because of the thin vertical oxide layer 10 surrounding the base and part of the collector, the regions are self-aligned. Therefore the base can be implanted without a mask and there is no requirement to space the regions according to the depletion region formed during operation. Since the polysilicon collector tap is formed within the original trench and the n-type collector region is buried, the overall size of the device is reduced.

This configuration affords greater conductive contact with the collector region and therefore significantly reduced collector resistance. Lower resistance makes operation at lower voltages possible, thus reducing power consumption and the associated heat dissipation requirement allowing a yet smaller structure. The smaller structure with its corresponding smaller capacitance and time delay allows for faster operation.

A description of the steps taken to generate a bipolar transistor using the invention may be helpful in describing the overall structure of the preferred embodiment. In this series of steps the final product is a bipolar transistor considerably smaller and faster than the prior art devices. We will try to concentrate exclusively on the formation of the collector contact and device isolation.

Figure 8:
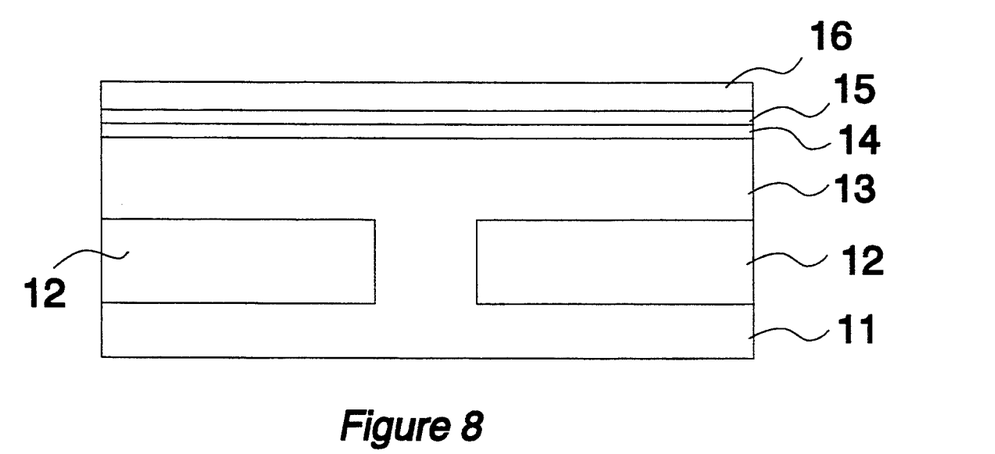
FIG. 8-15 are diagrammatic cross-sectional views of the substrate during subsequent steps in the fabrication of a semiconductor device using the invention.

Referring now to FIG. 8, we start with a planar silicon substrate of p-type silicon 11. Within this substrate an n+type region 12 is implanted using conventional techniques forming what will become the buried collector. Atop this layer is grown an epitaxial layer 13 which is doped conventionally to form the base and emitter regions or zones of the transistor (not shown). Upon this layer is added an insulating oxide layer 14. A nitride layer 15 is added which will act as a stopping point for a subsequent chemical-mechanical polish to be performed later. Another oxide layer 16 is then added atop the nitride.

Figure 9:
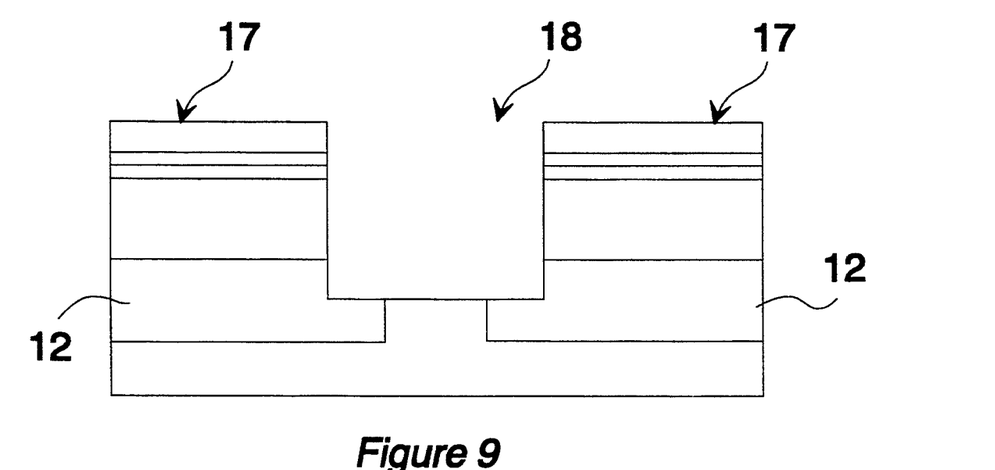

Using photolithographic techniques well known to the art, a network of trenches are etched through the oxide and down to the buried n+layer 12, creating a plurality of mesas 17, each of which will form a transistor. One of the trenches 18 is seen in FIG. 9.

Figure 10:
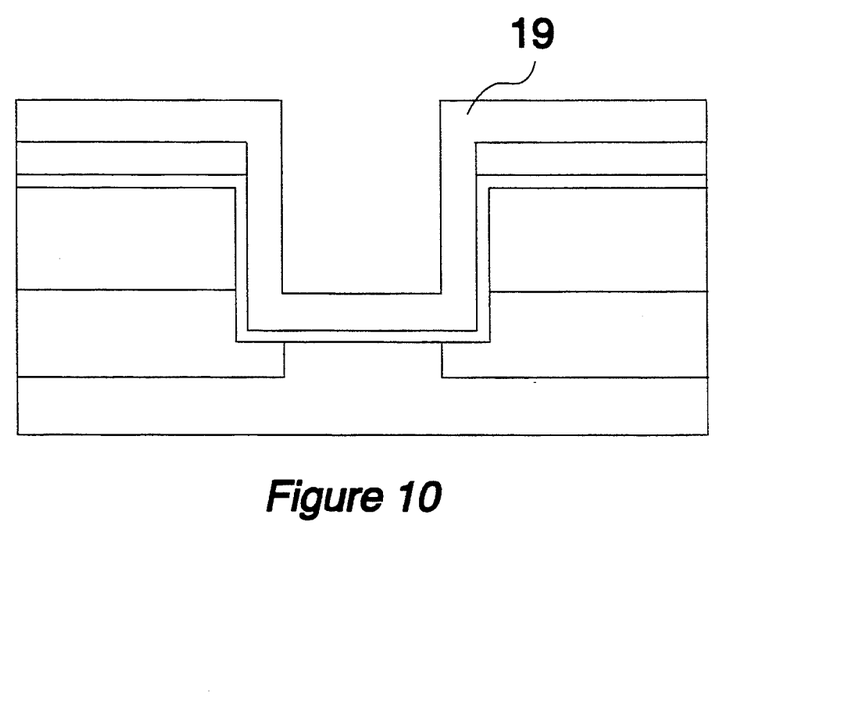
Figure 11:
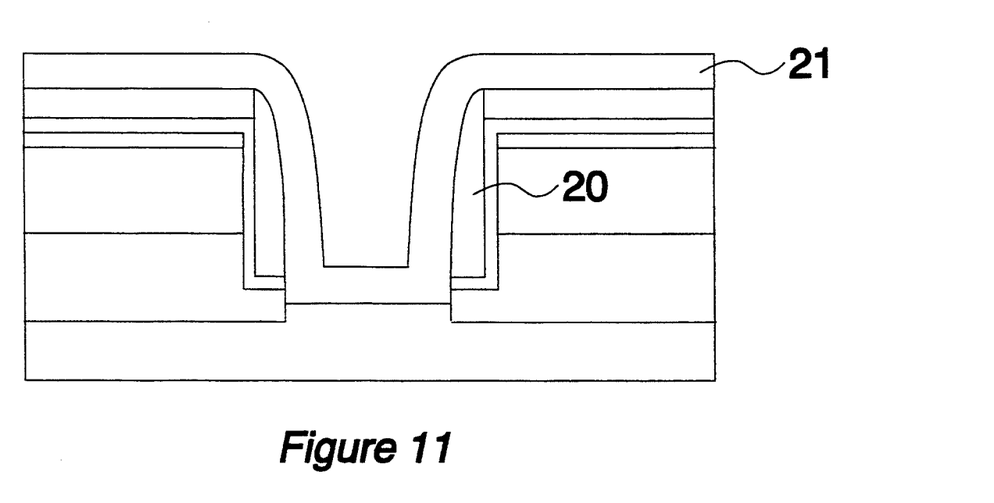

In FIG. 10 a layer of oxide 19 is deposited to coat the vertical walls of the trench with electrical insulation. Anisotropic etching is used to remove the horizontal portions of the oxide layer at the bottom of the trench and to leave gently curving vertical portions of the oxide layer 20 along with horizontal portions on top of the mesas as seen in FIG. 11. The remaining oxide region forms the proper surface for the deposition of a conductive polysilicon layer 21, coating both horizontal and vertical surfaces.

Figure 12:
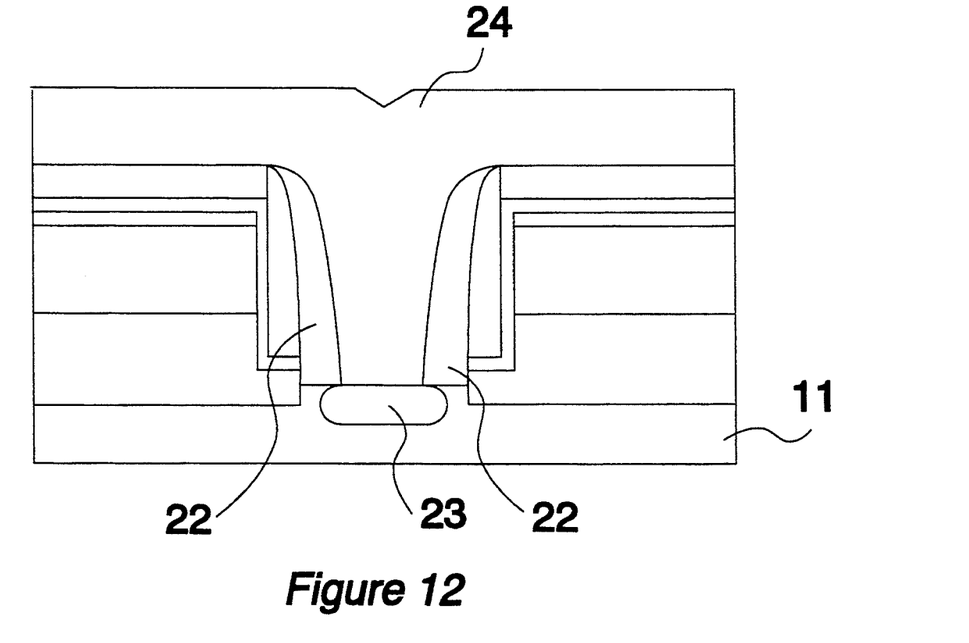

In FIG. 12 an anisotropic etch is performed to remove the horizontal portions of the polysilicon, leaving only gently curving vertical portions 22. The exposed substrate 11 at the bottom of the trench is then implanted with a p+region 23 to further isolate the mesas. An insulating layer of oxide 24 is deposited, filling the trench.

Figure 13:
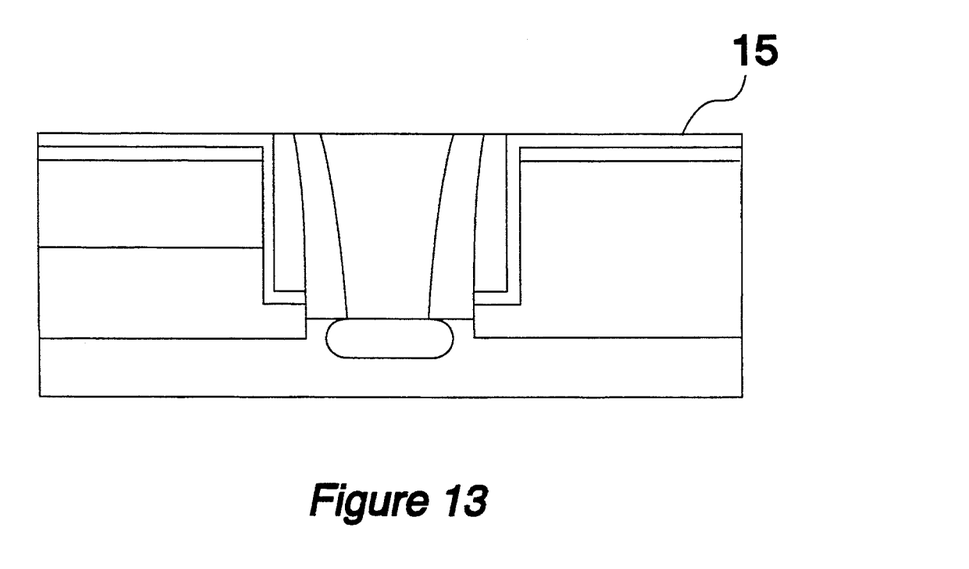

FIG. 13 is the result of a chemical-mechanical polish which removes all material above the nitride layer 15.

Figure 14:
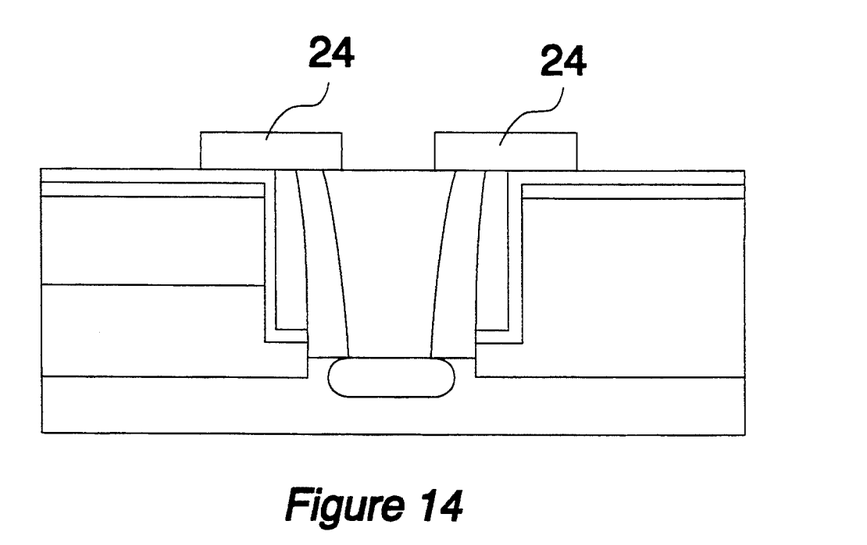
Figure 15:
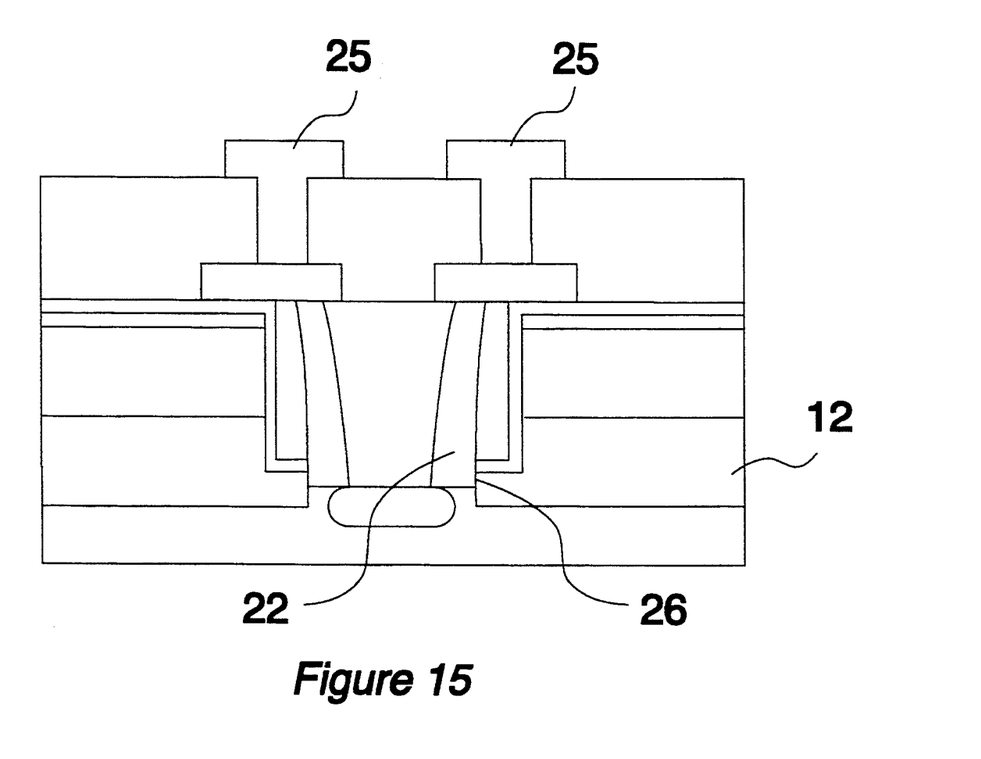

Atop this surface is added a layer of polysilicon which is then photo etched to form pads 24 as seen in FIG. 14. In FIG. 15 these pad structures create a greater target for subsequent addition of metal contacts 25 using conventional processing techniques.

Although FIG. 15 shows what seems to be a relatively small contact point 26 between the trench polysilicon 22 and the buried n+collector region 12, the trench and polysilicon can surround the mesa, providing a long region of contact.

Since the fabrication processing steps employed by this embodiment use relatively low temperature processing, it is possible to etch and fill the trench during the latter stages of fabrication allowing greater flexibility during manufacture. This flexibility will be valuable when different designs and devices use the invention.

Although this embodiment describes a totally isolated transistor mesa with contact pads on top, cross-connection or cross-coupling between devices could be accomplished using buried conductive material without departing from the invention.

Although this embodiment is directed toward creating a smaller, faster transistor, other bipolar semiconductor devices such as silicon controller rectifiers, other thyristors, and other multi-terminalled bipolar devices would benefit by using this scheme.

While the preferred embodiments of the invention have been described, modifications can be made and other embodiments may be devised without departing from the spirit of the invention and the scope of the appended claims.

What is claimed is:

1. A method for fabricating a semiconductor bipolar device for use in an integrated circuit comprising:
   forming a combination of substantially horizontal layers comprising:
   a semiconductor substrate layer;
   a buried layer on top of said substrate, said buried layer doped to form a semiconductor element of a first type;
   a first surface layer on top of said buried layer;
   a second surface layer embedded into a section of said first surface layer;
   an insulating oxide layer on top of said first and second surface layer;
   etching a trench network into said combination of layers from the top down into the buried layer thereby generating a mesa;
   depositing a substantially vertical layer of insulating material onto a vertical wall of said mesa;
   deepening the trench network, thereby exposing the buried layer;
   implanting an isolating region into a portion of the substrate exposed at a bottom end of the trench network:
   depositing a substantially vertical layer of polysilicon to exposed layers on said vertical wall of the mesa, filling the trench network with insulating material;
   creating a first tap to contact the polysilicon layer, a second tap to contact the first surface layer, and a third tap to contact the second surface layer.

2. The method of claim 1, wherein said step of forming said first surface layer comprises growing an epitaxial layer.

3. The method of claim 1, which further comprises:
   forming a stop layer atop said insulating oxide layer prior to said step of etching a trench network; and
   polishing the surface of said mesa down to said stop layer, after said step of filling the trench network with insulating material.

4. The method of claim 3, wherein said step of polishing is performed using a chemical mechanical polishing process.

5. The method of claim 1, wherein said step of depositing a substantially vertical layer of polysilicon comprises:
   depositing a coating layer of polysilicon; and
   anisotropically etching said coating layer, thereby removing horizontal portions of said coating layer.

6. The method of claim 1, wherein said step of depositing a substantially vertical layer of polysilicon occurs prior to said step of implanting an isolating region.

* * * * *